(12) United States Patent
Baker

(10) Patent No.: US 7,917,115 B2
(45) Date of Patent: Mar. 29, 2011

(54) METHOD AND SYSTEM FOR AUTO DETECTING AND AUTO SWITCHING ANTENNAS IN A MULTI-ANTENNA FM TRANSMIT/RECEIVE SYSTEM

(75) Inventor: Thomas Baker, Manhattan Beach, CA (US)

(73) Assignee: Broadcom Corporation, Irvine, CA (US)

( * ) Notice: Subject to any disclaimer, the term of this patent is extended or adjusted under 35 U.S.C. 154(b) by 784 days.

(21) Appl. No.: 11/832,598

(22) Filed: Aug. 1, 2007

(65) Prior Publication Data
US 2008/0233890 A1   Sep. 25, 2008

Related U.S. Application Data

(60) Provisional application No. 60/895,665, filed on Mar. 19, 2007.

(51) Int. Cl.
*H04B 1/06* (2006.01)
*H04B 7/00* (2006.01)

(52) U.S. Cl. ............... 455/277.1; 455/67.11; 455/67.14; 455/78; 455/81; 455/557; 455/575.1; 455/575.7; 455/344; 455/349; 324/527; 343/724; 343/725

(58) Field of Classification Search ............... 455/67.11, 455/67.14, 78–83, 557, 575.1, 575.7, 90.1–90.3, 455/277.1, 277.2, 344–349; 343/702, 724, 725; 324/527

See application file for complete search history.

(56) References Cited

U.S. PATENT DOCUMENTS

| | | | | |
|---|---|---|---|---|
| 6,853,197 | B1 * | 2/2005 | McFarland et al. | 324/549 |
| 7,242,917 | B2 * | 7/2007 | Abbasi et al. | 455/277.1 |
| 2005/0057404 | A1 * | 3/2005 | Demicco et al. | 343/702 |
| 2008/0096484 | A1 * | 4/2008 | Tuttle et al. | 455/41.2 |

* cited by examiner

*Primary Examiner* — Tuan A Tran
(74) *Attorney, Agent, or Firm* — McAndrews, Held & Malloy, Ltd.

(57) ABSTRACT

Methods and systems for auto detecting and auto switching antennas in a multi-antenna FM transmit/receive system are disclosed and may include detecting when an external antenna may be coupled to an external port of the wireless device and utilizing the external antenna for transmitting and/or receiving FM signals. The decoupling of an external antenna from an external port may be detected, which may cause the FM radio transmitter/receiver to be configured to transmit and/or receive FM signals utilizing antennas internal to the wireless device. One or more test signals, which may include AC signals, may be generated within the chip for detecting whether an external antenna may be coupled to an external port. A reflected signal from an external port may be measured and compared to a prestored value corresponding to a reflection due to an open circuit at the one or more external ports of the wireless device.

36 Claims, 11 Drawing Sheets

METHOD AND SYSTEM FOR AUTO DETECTING AND AUTO SWITCHING ANTENNAS IN A MULTI-ANTENNA FM TRANSMIT/RECEIVE SYSTEM

CROSS-REFERENCE TO RELATED APPLICATIONS/INCORPORATION BY REFERENCE

This application makes reference to and claims priority to U.S. Provisional Application Ser. No. 60/895,665, filed on Mar. 19, 2007, which is hereby incorporated herein by reference in its entirety.

This application makes reference to:
U.S. patent application Ser. No. 11/832,590 filed on Aug. 1, 2007;
U.S. patent application Ser. No. 11/832,609 filed on Aug. 1, 2007;
U.S. patent application Ser. No. 11/832,468 filed on Aug. 1, 2007; and
U.S. patent application Ser. No. 11/832,488 filed on Aug. 1, 2007.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for auto detecting and auto switching antennas in a multi-antenna FM transmit/receive system.

BACKGROUND OF THE INVENTION

With the increasing popularity of various wireless standards and technologies, there is a growing demand to provide a simple and complete solution for wireless communications applications. Some wireless communication devices utilize a plurality of wireless technologies and may require separate processing hardware and/or separate processing software. Moreover, coordinating the reception and/or transmission of data to and/or from the portable electronic device may require significant processing overhead that may impose certain operation restrictions and/or design challenges. For example, Bluetooth and Wireless LAN may pose certain coexistence problems caused by the close proximity of the Bluetooth and WLAN transceivers.

Furthermore, simultaneous use of a plurality of radios in a handheld communication device may result in significant increases in power consumption. Power being a precious commodity in most wireless mobile devices, devices that utilize a plurality of wireless technologies require careful design and implementation in order to minimize battery usage. Accordingly, the transmission of these multiple wireless protocol signals may require novel transmitter and receiver designs to share components within the device and optimize power usage.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for auto detecting and auto switching antennas in a multi-antenna FM transmit/receive system, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for auto detecting and auto switching antennas in a multi-antenna FM transmit/receive system. Exemplary aspects of the invention may comprise detecting whether an external antenna may be coupled to one or more external port of the wireless device. The wireless device may comprise a portable or mobile wireless end user communication device. FM signals may be transmitted and/or received via the FM radio transmitter and/or FM radio receiver respectively, in instances when the external antenna may be detected. The FM radio transmitter may be configured for transmitting the FM signal via the external antenna when the external antenna may be detected, and the FM radio receiver may be configured for receiving the FM signals via the external antenna when the external antenna may be detected. In instances when the one or more external antennas may be decoupled from one or more of the external ports, such decoupling may be detected. The FM radio transmitter and FM radio receiver may be configured to transmit and/or receive the FM signal, respectively, utilizing antennas internal to the wireless device when the decoupling of the one or more external antennas may be detected. One or more test signals may be generated within the chip for detecting whether the external antenna may be coupled to the one or more external ports of the wireless device. A reflected signal resulting from a reflection of the generated one or more test signals when the generated test signal may be communicated to the one or more external ports of the wireless device may be measured and compared to a prestored value corresponding to a reflection due to an open circuit at the one or more external ports of the wireless device. The test signal may comprise an AC signal.

Figure 1A:
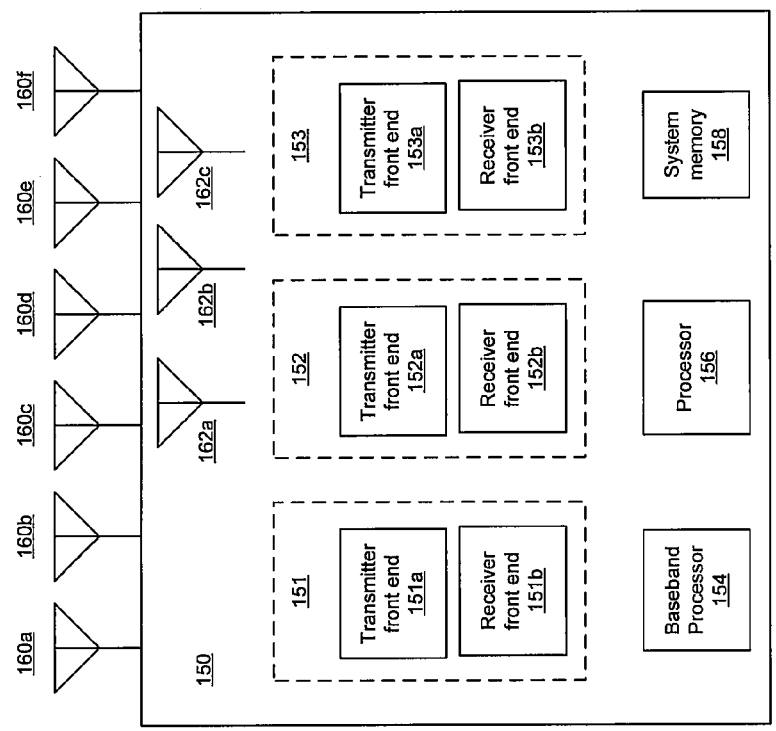
FIG. 1A is a block diagram of an exemplary system that enables multi-protocol communication, in accordance with an embodiment of the invention.

FIG. 1A is a block diagram of an exemplary system that enables multi-protocol communication, in accordance with an embodiment of the invention. Referring to FIG. 1A, there is shown a mobile terminal 150 comprising a plurality of transceivers 151, 152, and 153, a baseband processor 154, a processor 156, external antennas 160a-f, internal antennas 162a-c and system memory 158. The transceivers 151, 152, and 153 may each comprise a transmitter front end 151a, 152a, 153a, respectively, and a receiver front end 151b, 152b, 153b, respectively.

The transmitter front ends 151a, 152a, and 153a may comprise suitable circuitry, logic, and/or code that may be adapted to process and transmit RF signals. In an embodiment of the invention, the transmitter and receiver front ends for each wireless protocol may be integrated on a single chip. In another embodiment of the invention, each of the transceivers may be integrated on a single chip.

The external antennas 160a-f and the internal antennas 162a-c may comprise antennas that may be used for different wireless protocols, such as Bluetooth, NFC, WLAN and FM, for example. The external antennas may be attached or detached from the wireless device 150, and may comprise components that may be used for purposes other than acting solely as antennas, such as speakers or earphones, for example. The internal antennas 162a-c may each comprise any metal component within the wireless communication device that may act as an antenna. One or more of the antennas may be selected to transmit and/or receive wireless signals. In an embodiment of the invention, a plurality of combinations of selected antennas may be switched on, and received signals may be measured and compared to assess the optimum antenna configuration at a particular frequency.

The transmitter front ends 151a, 152a, and 153a may receive baseband signals communicated by a baseband processor, such as, for example, the baseband processor 154. The signals may then be, for example, filtered, amplified, upconverted, and/or modulated for transmission. The baseband signal may be analog or digital depending on the functionality of the transmitter front end 151a, 152a, or 153a and the baseband processor 154.

The receiver front ends 151b, 152b, and 153b may comprise suitable circuitry, logic, and/or code that may be adapted to receive and process RF signals. The receiver front ends 151b, 152b, and 153b may amplify, filter, down-convert, and/or demodulate the received signals to generate a baseband signal. The baseband signal may be analog or digital depending on the functionality of the receiver front end 151b, 152b, or 153b and the baseband processor 154.

The baseband processor 154 is depicted as a single block for the sake of simplicity, however, the invention need not be so limited. For example, other embodiments of the invention may comprise a plurality of baseband processors for processing signals to and/or from the transceivers 151, 152, and 153.

The baseband processor 154 may comprise suitable circuitry, logic, and/or code that may be adapted to process received baseband signals from the receiver front ends 151b, 152b, and 153b. The baseband processor 154 also may comprise suitable logic, circuitry, and/or code that may be adapted to process a baseband signal for communication to the transmitter front ends 151a, 152a, and 153a.

The processor 156 may comprise suitable logic, circuitry, and/or code that may be adapted to control the operations of the transceivers 151, 152, and 153 and/or the baseband processor 154. For example, the processor 156 may be utilized to update and/or modify programmable parameters and/or values in a plurality of components, devices, and/or processing elements in the transceivers 151, 152, and 153 and/or the baseband processor 154. Control and/or data information may also be transferred to and/or from another controller and/or processor in the mobile terminal 150 to the processor 156. Similarly, the processor 156 may transfer control and/or data information to another controller and/or processor in the mobile terminal 150.

In operation, the processor 156 may utilize the received control and/or data information to determine a mode of operation for the transceivers 151, 152, and/or 153. For example, the processor 156 may control each of the receiver front ends 151b, 152b, and 153b to receive RF signals at a specific frequency. Similarly, the processor 156 may control each of the transmitter front ends 151a, 152a, and 153a to transmit RF signals at a specific frequency. The processor 156 may also adjust a specific gain for a variable gain amplifier, and/or adjust filtering characteristics for a filter. Moreover, a specific frequency selected and/or parameters needed to calculate the specific frequency, and/or the specific gain value and/or the parameters needed to calculate the specific gain, may be stored in the system memory 158 via the processor 156. This information stored in system memory 158 may be transferred to the receiver front end 152 from the system memory 158 via the processor 156. The system memory 158 may comprise suitable circuitry, logic, and/or code that may be adapted to store a plurality of control and/or data information, including parameters needed to calculate frequencies and/or gain, and/or the frequency value and/or gain value.

The wireless protocols transmitted and received by the mobile terminal 150 may comprise FM, WLAN, Bluetooth and near field communication (NFC), for example. Antenna design may be more challenging for the transmission and reception of FM signals, as the wavelength becomes larger when compared to the size of the wireless device 150. External devices, such as earphones, for example, that may be plugged into a port of the wireless device 150 may improve FM reception. Thus, the ability to automatically detect when an external device is coupled to a port on the wireless device 150 that may be used to receive FM signals may improve reception.

Figure 1B:
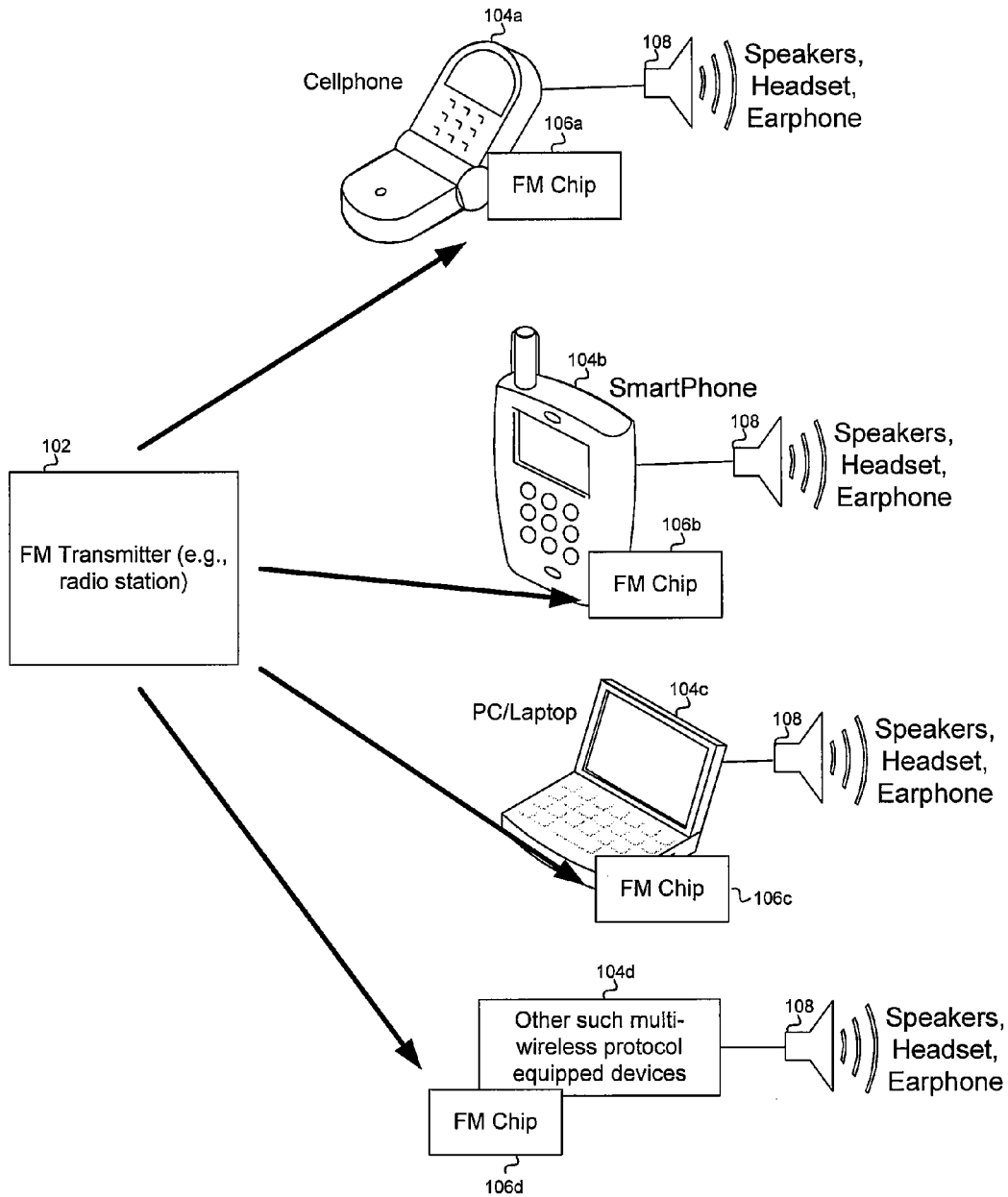
FIG. 1B is a block diagram of an exemplary FM transmitter that communicates with handheld devices that utilize a single chip with an integrated FM transmitter and receiver, in accordance with an embodiment of the invention.

FIG. 1B is a block diagram of an exemplary FM transmitter that communicates with handheld devices that utilize a single chip with an integrated FM transmitter and receiver, in accordance with an embodiment of the invention. Referring to FIG. 1B, there is shown an FM transmitter 102, a cellular phone 104a, a smart phone 104b, a computer 104c, and an exemplary multi-wireless protocol equipped device 104d. The FM transmitter 102 may be implemented as part of a radio station or other broadcasting device, for example. Each of the cellular phone 104a, the smart phone 104b, the computer 104c, and the exemplary multi-wireless protocol equipped device 104d may comprise a single chip 106a, 106b, 106c and 106d with an integrated FM transmitter and receiver. The FM transmitter 102 may enable communication of FM audio data to the devices shown in FIG. 1B by utilizing the single chip 106a, 106b, 106c and 106d in each device. Each of the devices in FIG. 1B may comprise and/or may be communicatively coupled to a listening device 108 such as a speaker, a headset, or an earphone, for example.

The cellular phone 104a may be enabled to receive an FM transmission signal from the FM transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart phone 104b may be enabled to receive an FM transmission signal from the FM transmitter 102. The user of the smart phone 104b may then listen to the transmission via the listening device 108.

The computer 104c may be a desktop, laptop, notebook, tablet, and/or a PDA, for example. The computer 104c may be enabled to receive an FM transmission signal from the FM transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices are shown in FIG. 1B, the single chip 106 may be utilized in a plurality of other devices and/or systems that receive and use multiple wireless protocols such as Bluetooth, NFC, WLAN, RFID and FM signals, for example.

For each wireless device 104a-d, the listening device 108 may also act as antenna for the reception of FM signals due to its larger size as compared to built-in antennas internal to the wireless devices. The listening device may be connected or disconnected at any time, testing for the presence of an externally coupled device, such as the listening device 108, may be performed at regular intervals. In another embodiment of the invention, the wireless device may sense externally coupled devices continually.

Figure 1C:
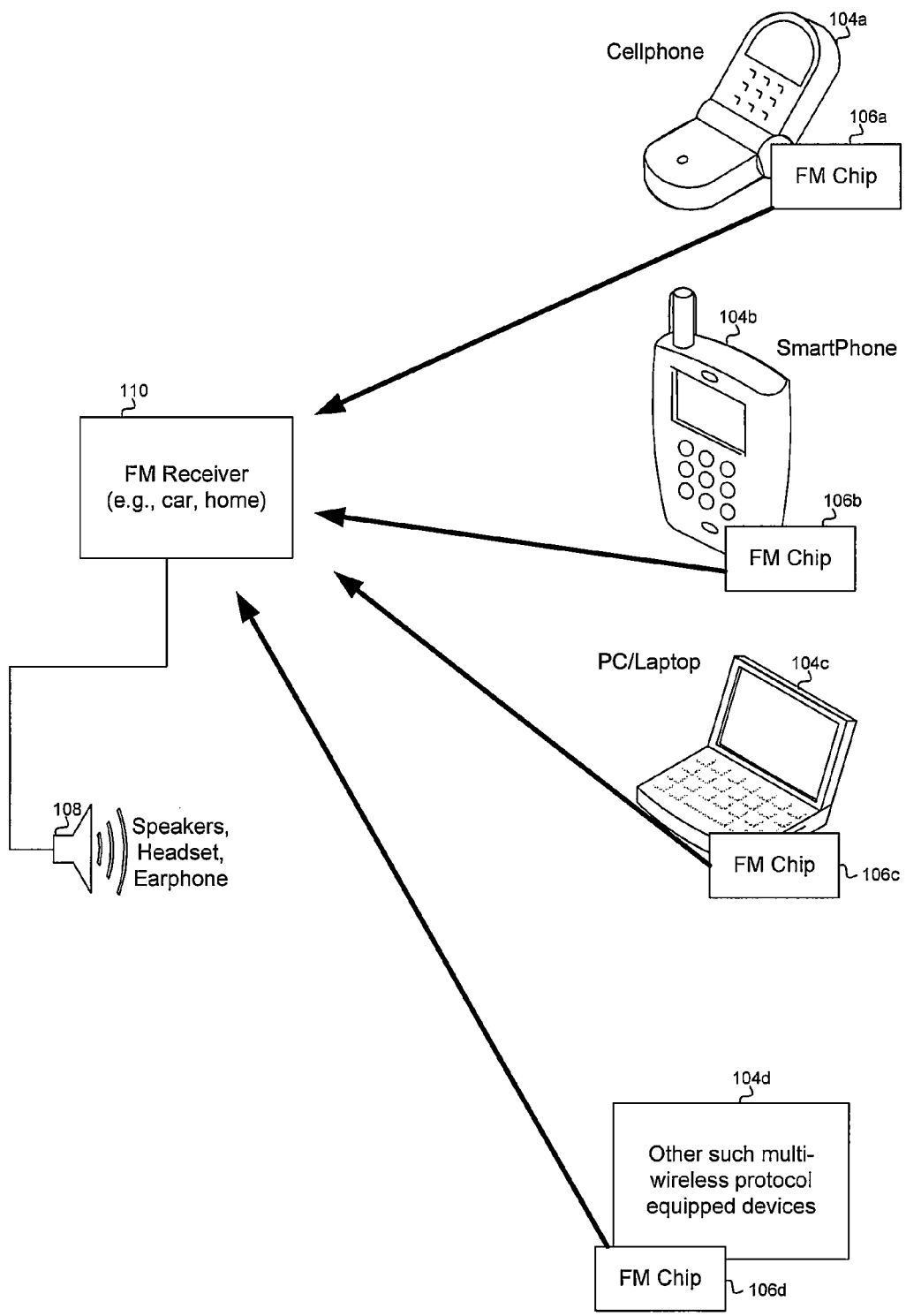
FIG. 1C is a block diagram of an exemplary FM receiver that communicates with handheld devices that utilize a single chip with an integrated FM transmitter and FM receiver in accordance with an embodiment of the invention.

FIG. 1C is a block diagram of an exemplary FM receiver that communicates with handheld devices that utilize a single chip with an integrated FM transmitter and FM receiver in accordance with an embodiment of the invention. Referring to FIG. 1C, there is shown an FM receiver 110, the cellular phone 104a, the smart phone 104b, the computer 104c, and the exemplary multi-wireless protocol equipped device 104d. In this regard, the FM receiver 110 may comprise and/or may be communicatively coupled to a listening device 108. A device equipped with an integrated FM transmitter and FM receiver, such as the single chip 106a, 106b, 106c or 106d, may be able to transmit or broadcast its respective signal to a "deadband" of an FM receiver for use by the associated audio system. For example, a cellphone or a smart phone, such as the cellular phone 104a and the smart phone 104b, may transmit a telephone call for listening over the audio system of an automobile, which may comprise the FM receiver 110 and the speakers 108, via usage of a deadband area of the car's FM stereo system. This may provide a universal capability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of the FM receiver 110 which may be part of a home stereo system. The music on the computer 104c may then be listened to on a standard FM receiver such as the FM receiver 110, with few, if any, other external FM transmission devices or connections. While a cellular phone 104a, a smart phone 104b, and computing device 106c are shown, a single chip that combines an FM transmitter and an FM receiver may be utilized in a plurality of other devices and/or systems that receive and use an FM signal.

For each wireless device 104a-d, the listening device 108 may also act as antenna for the transmission of FM signals due to its larger size as compared to built-in antennas internal to the wireless devices. The listening device 108 may be connected or disconnected at any time, so testing for the presence of an externally coupled device, such as the listening device 108, may be performed at regular intervals. In another embodiment of the invention, the wireless device may sense externally coupled devices continually.

Figure 1D:
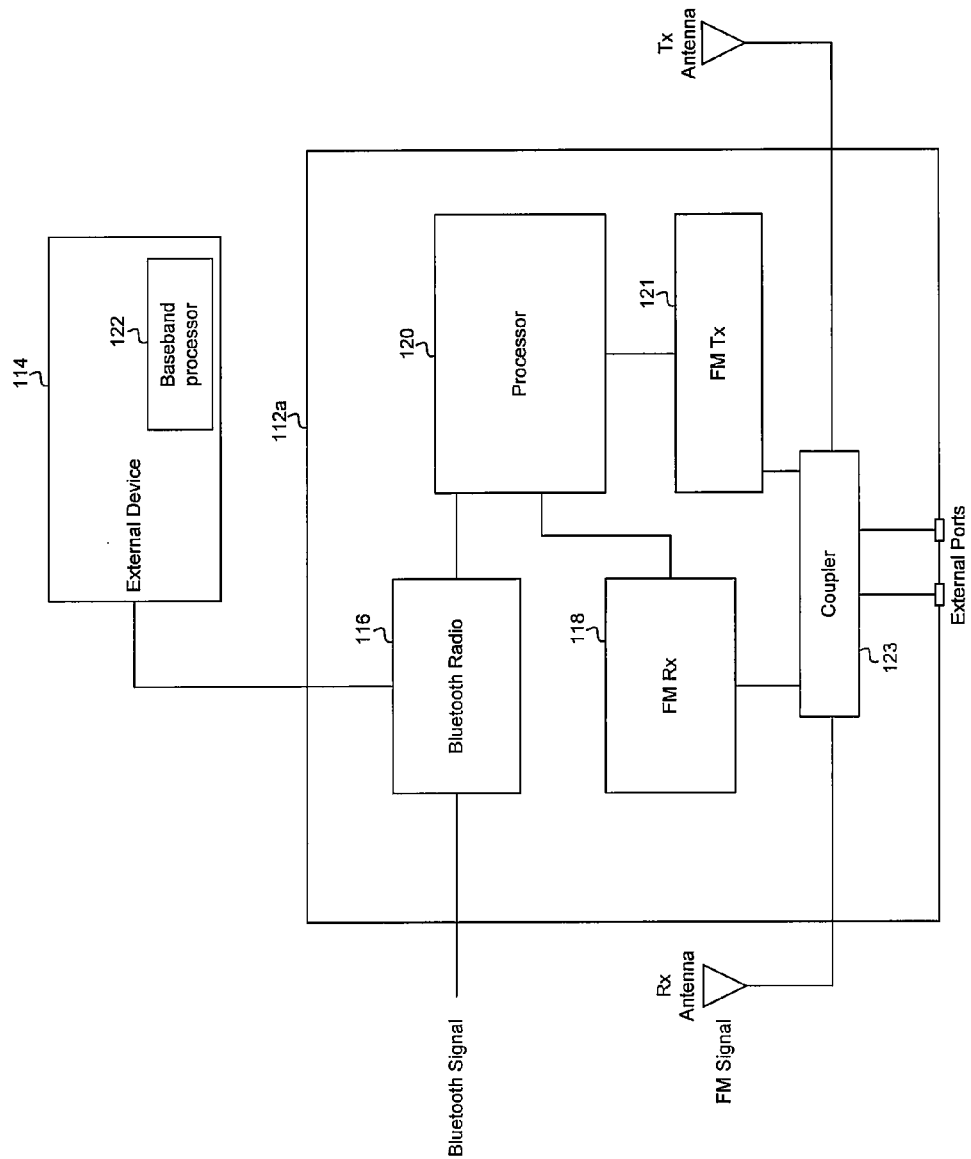
FIG. 1D is a block diagram of an exemplary single chip with integrated Bluetooth and FM radio Tx and FM radio Rx that supports FM processing and an external device that supports Bluetooth processing, in accordance with an embodiment of the invention.

FIG. 1D is a block diagram of an exemplary single chip with integrated Bluetooth and FM radio Tx and FM radio Rx that supports FM processing and an external device that supports Bluetooth processing, in accordance with an embodiment of the invention. Referring to FIG. 1D, there is shown a single chip 112a that supports Bluetooth and FM radio Tx and FM radio Rx operations and an external device 114. The single chip 112a may comprise an integrated Bluetooth radio 116, an integrated FM radio Rx 118, an integrated processor 120, a coupler 123 and an FM transmitter (Tx) 121. The Bluetooth radio 116 may comprise suitable logic, circuitry, and/or code that enable Bluetooth signal communication via the single chip 112a. In this regard, the Bluetooth radio 116 may support processing, playback and communication of audio signals. The FM radio Rx 118 may comprise suitable logic, circuitry, and/or code that enable reception of FM signals via the single chip 112a.

The integrated processor 120 may comprise suitable logic, circuitry, and/or code that may enable processing of the FM data received by the FM radio Rx 118. Moreover, the integrated processor 120 may enable processing of FM data to be transmitted by the FM radio Tx 121. The external device 114 may comprise a baseband processor 122. The baseband processor 122 may comprise suitable logic, circuitry, and/or code that may enable processing of Bluetooth data received by the Bluetooth radio 116. Moreover, the baseband processor 122 may enable processing of Bluetooth data to be transmitted by the Bluetooth radio 116. In this regard, the Bluetooth radio 116 may communicate with the baseband processor 122 via the external device 114. The Bluetooth radio 116 may communicate with the integrated processor 120. The FM radio Tx 121 may comprise suitable logic, circuitry, and/or logic that may enable transmission of FM signals via appropriate broadcast channels, for example.

The coupler 123 may comprise suitable circuitry, logic and/or code for coupling the Rx and Tx antennas, or external antennas coupled to the external ports, to the FM radio Rx 118 and the FM radio Tx 121. In this manner, each, or both antennae may be utilized to transmit and/or receive FM signals. A maximum transmit and/or received signal may be obtained if a suitable external antenna is coupled to the single chip 112*a*.

Figure 1E:
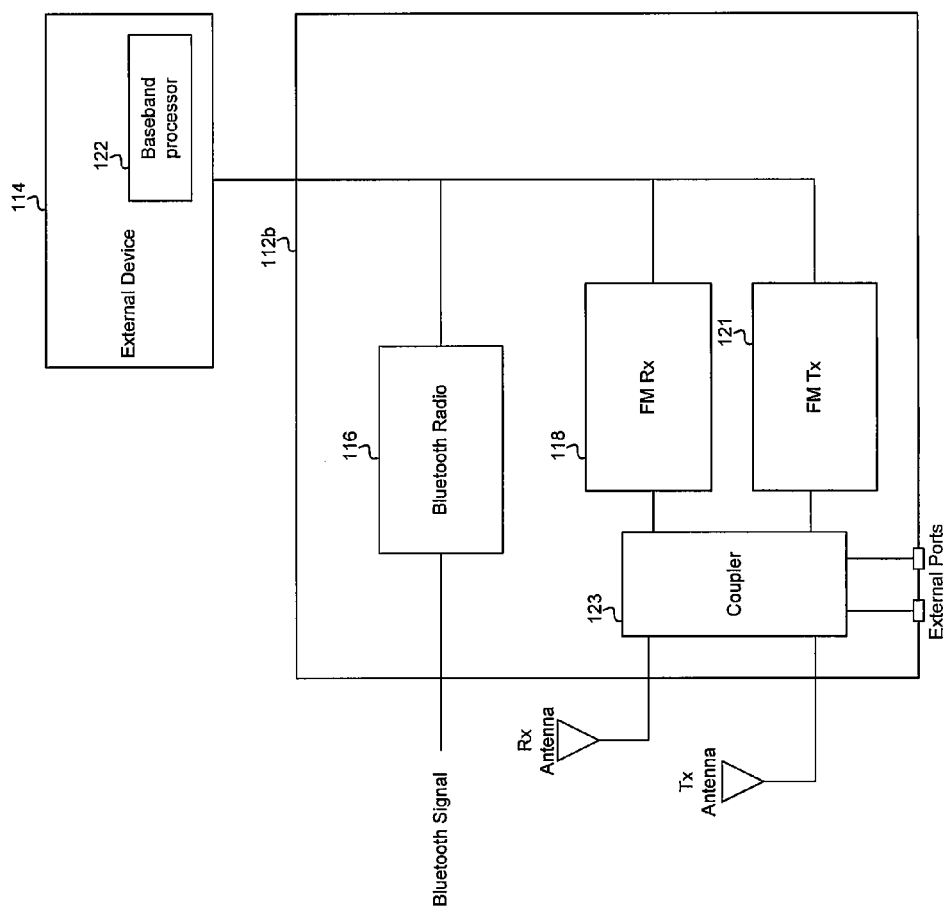
FIG. 1E is a block diagram of an exemplary single chip with integrated Bluetooth and FM radios and an external device that supports Bluetooth and FM processing, in accordance with an embodiment of the invention.

FIG. 1E is a block diagram of an exemplary single chip with Integrated Bluetooth and FM radios and an external device that supports Bluetooth and FM processing, in accordance with an embodiment of the invention. Referring to FIG. 1E, there is shown a single chip 112*b* that supports Bluetooth and FM radio operations and an external device 114. The single chip 112*b* may comprise the Bluetooth radio 116, an FM radio Rx 118, a coupler 123 and an FM radio Tx 121. The Bluetooth radio 116 and/or the FM radio Rx 118 and FM radio Tx 121 may be integrated into the single chip 112*b*. The external device 114 may comprise a baseband processor 122.

The baseband processor 122 may comprise suitable logic, circuitry, and/or code that may enable processing of Bluetooth data received by the Bluetooth radio 116 and/or processing of Bluetooth data to be transmitted by the Bluetooth radio 116. In this regard, the Bluetooth radio 116 may communicate with the baseband processor 122 via the external device 114. Moreover, the baseband processor 122 may comprise suitable logic, circuitry, and/or code that may enable processing of the FM data received by the FM radio Rx 118. The baseband processor 122 may enable processing FM data to be transmitted by the FM radio Tx 121. In this regard, the FM radio Rx 118 and the FM radio Tx 121 may communicate with the baseband processor 122 via the external device 114. The coupler 123 may be substantially similar to the coupler 123 described with respect to FIG. 1D, and may be enabled to select antennas for transmission and reception, such that either antenna, or an externally coupled antenna, may be used for transmission and/or reception. By monitoring external ports on the wireless device for external antennas, and optimum receive and/or transmit signal may be obtained.

Figure 1F:
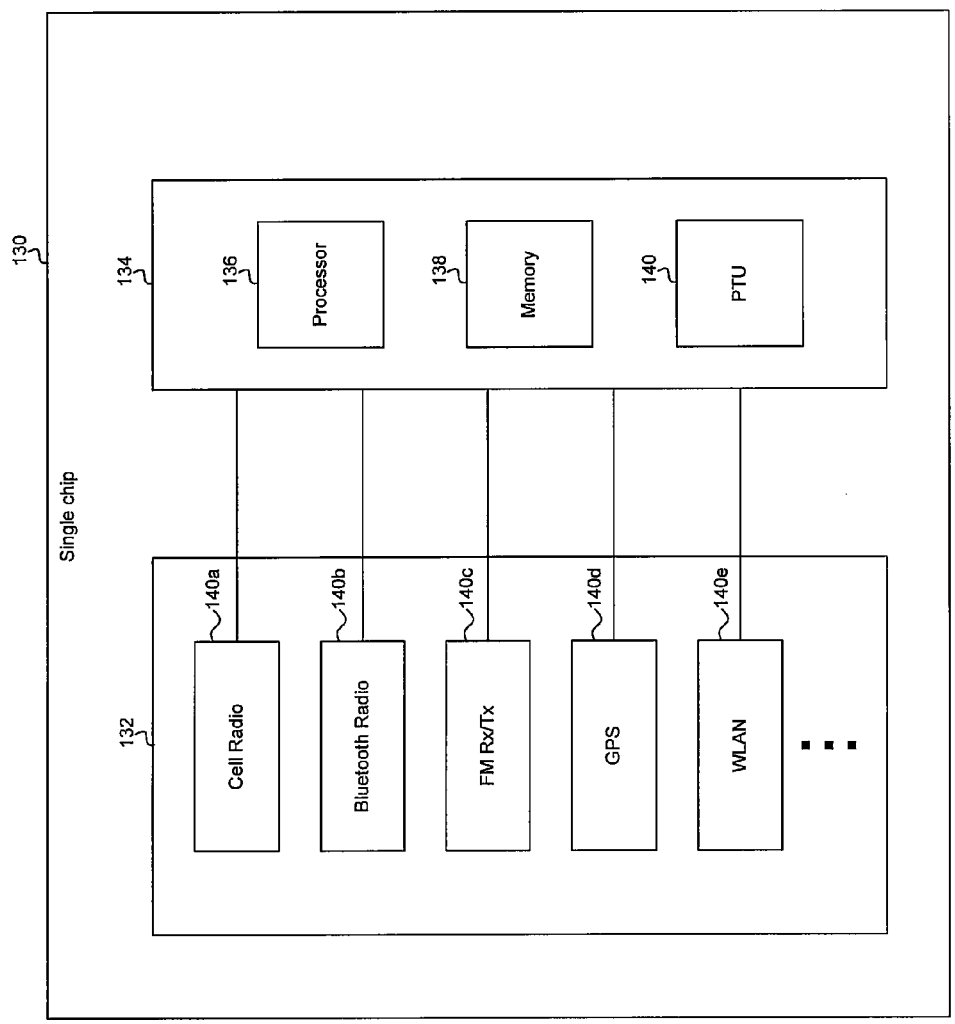
FIG. 1F is a block diagram of an exemplary single chip with multiple integrated radios that supports radio data processing, in accordance with an embodiment of the invention.

FIG. 1F is a block diagram of an exemplary single chip with multiple integrated radios that supports radio data processing, in accordance with an embodiment of the invention. Referring to FIG. 1F, there is shown a single chip 130 that may comprise a radio portion 132 and a processing portion 134. The radio portion 132 may comprise a plurality of integrated radios. For example, the radio portion 132 may comprise a cell radio 140*a* that supports cellular communications, a Bluetooth radio 140*b* that supports Bluetooth communications, an FM receive and transmit (Rx/Tx) radio 140*c* that supports FM communications, a global positioning system (GPS) 140*d* that supports GPS communications, and/or a wireless local area network (WLAN) 140*e* that supports communications based on the IEEE 802.11 standards.

The processing portion 134 may comprise at least one processor 136, a memory 138, and a peripheral transport unit (PTU) 140. The processor 136 may comprise suitable logic, circuitry, and/or code that enable processing of data received from the radio portion 132. In this regard, each of the integrated radios may communicate with the processing portion 134. In some instances, the integrated radios may communicate with the processing portion 134 via a common bus, for example. The memory 138 may comprise suitable logic, circuitry, and/or code that enable storage of data that may be utilized by the processor 136. In this regard, the memory 138 may store at least a portion of the data received by at least one of the integrated radios in the radio portion 132. Moreover, the memory 138 may store at least a portion of the data that may be transmitted by at least one of the integrated radios in the radio portion 132. The PTU 140 may comprise suitable logic, circuitry, and/or code that may enable interfacing data in the single chip 130 with other devices that may be communicatively coupled to the single chip 130. In this regard, the PTU 140 may support analog and/or digital interfaces.

By integrating the FM radio Tx and FM radio Rx functions on a single chip with a tunable oscillator, external ports may be monitored for the connection of external antennas that may improve reception and/or transmission of wireless signals.

Figure 2:
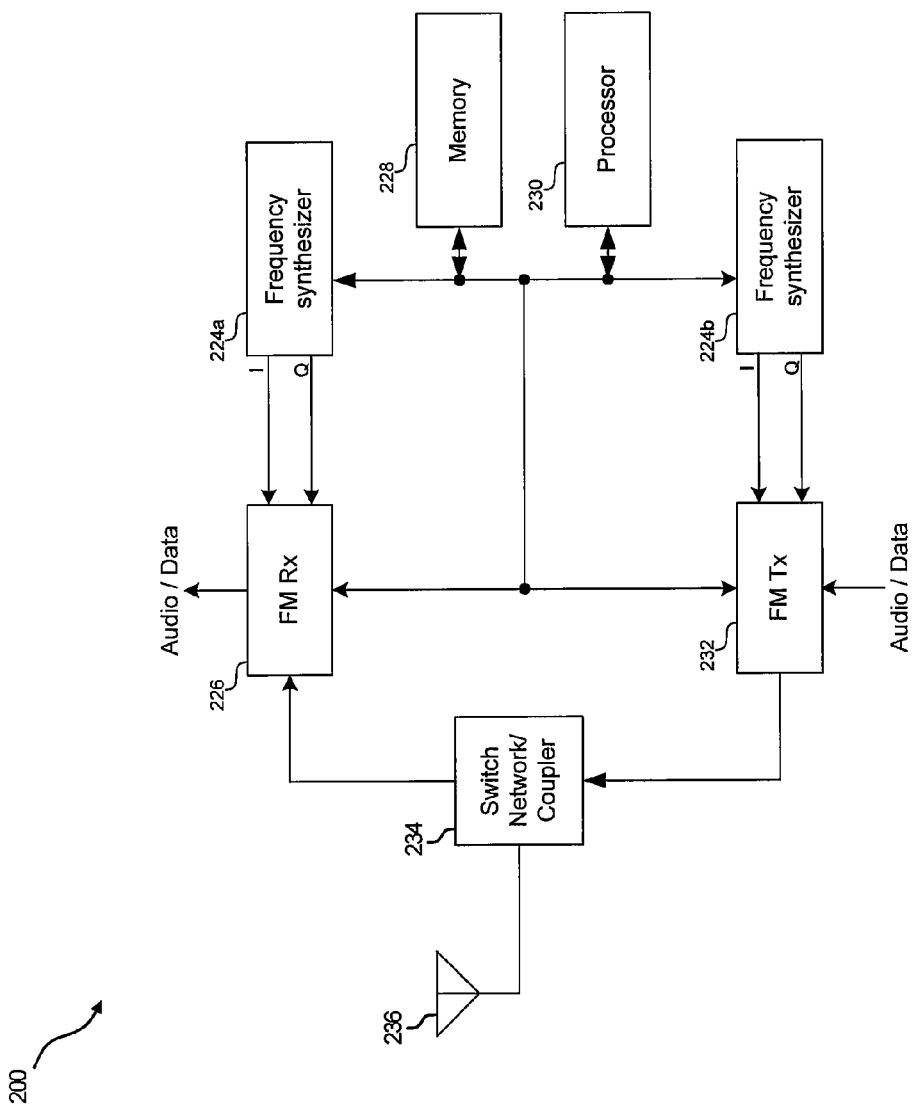
FIG. 2 is a block diagram of an exemplary system for FM transmission and reception, in accordance with an embodiment of the invention.

FIG. 2 is a block diagram of an exemplary system for FM transmission and reception, in accordance with an embodiment of the invention. Referring to FIG. 2, the radio 200 may comprise two frequency synthesizers 224*a* and 224*b*, an FM receive (Rx) block 226, a memory 228, a processor 230, a switch network/coupler 234, an antenna block 236 and an FM transmit (Tx) block 232.

The frequency synthesizers 224*a* and 224*b* may comprise suitable circuitry, logic, and/or code that may enable generation of fixed or variable frequency signals. For example, the frequency synthesizers 224*a* and 224*b* may each comprise one or more direct digital frequency synthesizers, along with a clock source, such as a Bluetooth or RFID phase-locked loop (PLL) clock generator.

The memory 228 may comprise suitable circuitry, logic, and/or code that may enable storing information. In this regard, the memory 228 may, for example, enable storing information utilized for controlling and/or configuring the frequency synthesizers 224*a* and 224*b*. For example, the memory 228 may store the value of state variables that may be utilized to control the frequency output by each of the frequency synthesizers 224*a* and 224*b*. Additionally, the memory 228 may enable storing information that may be utilized to configure the FM radio Rx block 226 and the FM radio Tx block 232. In this regard, the FM radio Rx block 226 and/or the FM radio Tx block 232 may comprise circuitry, logic, and/or code such as a filter, for example, that may be configured based on the desired frequency of operation.

The processor 230 may comprise suitable circuitry, logic, and/or code that may enable interfacing to the memory 228, the frequency synthesizers 224*a* and 224*b*, the FM radio Rx block 226 and/or the FM radio Tx block 232. In this regard, the processor 230 may be enabled to execute one or more instructions that enable reading and/or writing to/from the memory 228. Additionally, the processor 230 may be enabled to execute one or more instructions that enable providing one or more control signals to the frequency synthesizer 224, the FM radio Rx block 226, and/or the FM radio Tx block 232.

The FM radio Rx block 226 may comprise suitable circuitry, logic, and/or code that may enable reception of FM signals. In this regard, the FM radio Rx block 226 may be enabled to tune to a desired channel, amplify received signals, down-convert received signals, and/or demodulate received signals to, for example, output data and/or audio information comprising the channel. For example, the FM radio Rx block 226 may utilize in-phase and quadrature local oscillator signals generated by the frequency synthesizer 224*a* to down-convert received FM signals. The FM radio Rx block 226 may, for example, be enabled to operate over the "FM broadcast band", or approximately 60 MHz to 130 Mhz. Signal processing performed by the FM radio Rx block 226 may be performed in the analog domain or the digital domain. In this regard, the FM radio Rx block 226 may comprise one or more analog to digital converters (ADCs) and/or digital to analog converters (DACs) which may enable processing in the analog and/or digital domain.

The FM radio Tx block 232 may comprise suitable circuitry, logic, and/or code that may enable transmission of FM signals. In this regard, the FM radio Tx block 232 may enable frequency modulation of a carrier signal with audio/data information. In this regard, the carrier frequency may be generated by the clock frequency synthesizer 224b. The FM radio Tx block 232 may also enable up-converting a modulated signal to a frequency, for example, in the "FM broadcast band", or approximately 60 MHz to 130 MHz. Additionally, the FM radio Tx block 232 may enable buffering and/or amplifying an FM signal such that the signal may be transmitted via an antenna. In another embodiment of the invention, the frequency synthesizer 224a may comprise a DDFS that may be capable of providing FM modulation for the signal to be transmitted.

The switch network/coupler 234 may comprise suitable circuitry, logic and or code that may enable coupling the FM radio Tx block 232 and the FM radio Rx block 226 to the antenna block 236 for the transmission and reception of wireless signals. In an embodiment of the invention, the antenna block 236 may comprise a plurality of antennas. In this case, the switch network/coupler 234 may couple the FM radio Tx block 232 and the FM radio Rx block 226 to the plurality of antennas. The plurality of antennas may comprise internal and externally coupled antennas, or even various metal components within the housing which may contain the radio 200 or even metal components of the housing itself. Externally coupled antennas may comprise devices that may be utilized for other purposes, such as earphones, for example, and may improve transmission and reception of FM signals as compared to utilizing only built-in antennas.

In an exemplary operation of the system 200, one or more signals provided by the processor 230 may configure the system 200 to transmit and/or receive FM signals. To receive FM signals, the processor 230 may provide one or more control signals to frequency synthesizers 224a and 224b in order to generate appropriate LO frequencies based on the reference signal $f_{ref}$. In this regard, the processor may interface to the memory 228 in order to determine the appropriate state of any control signals provided to the frequency synthesizers 224a and 224b. In this manner, the transmit frequency and receive frequency may be determined independently. Accordingly, utilizing a transmit frequency different from the receive frequency may enable simultaneous transmission and reception of FM signals.

The switch network/coupler 234 may be utilized to configure the antenna 236 which may comprise one or more antennas. A plurality of antenna configurations may be configured to determine the configuration that results in the strongest received signal measured. In instances where an external device, such as earphones, may be coupled to the wireless device comprising the radio 200, it may be utilized to improve FM transmission and reception. Since the external device may be connected and disconnected from the device at any time, it may be advantageous to automatically sense whether the device may be present, and configure the radio 200 to utilize the externally coupled device as an antenna when present.

Figure 3:
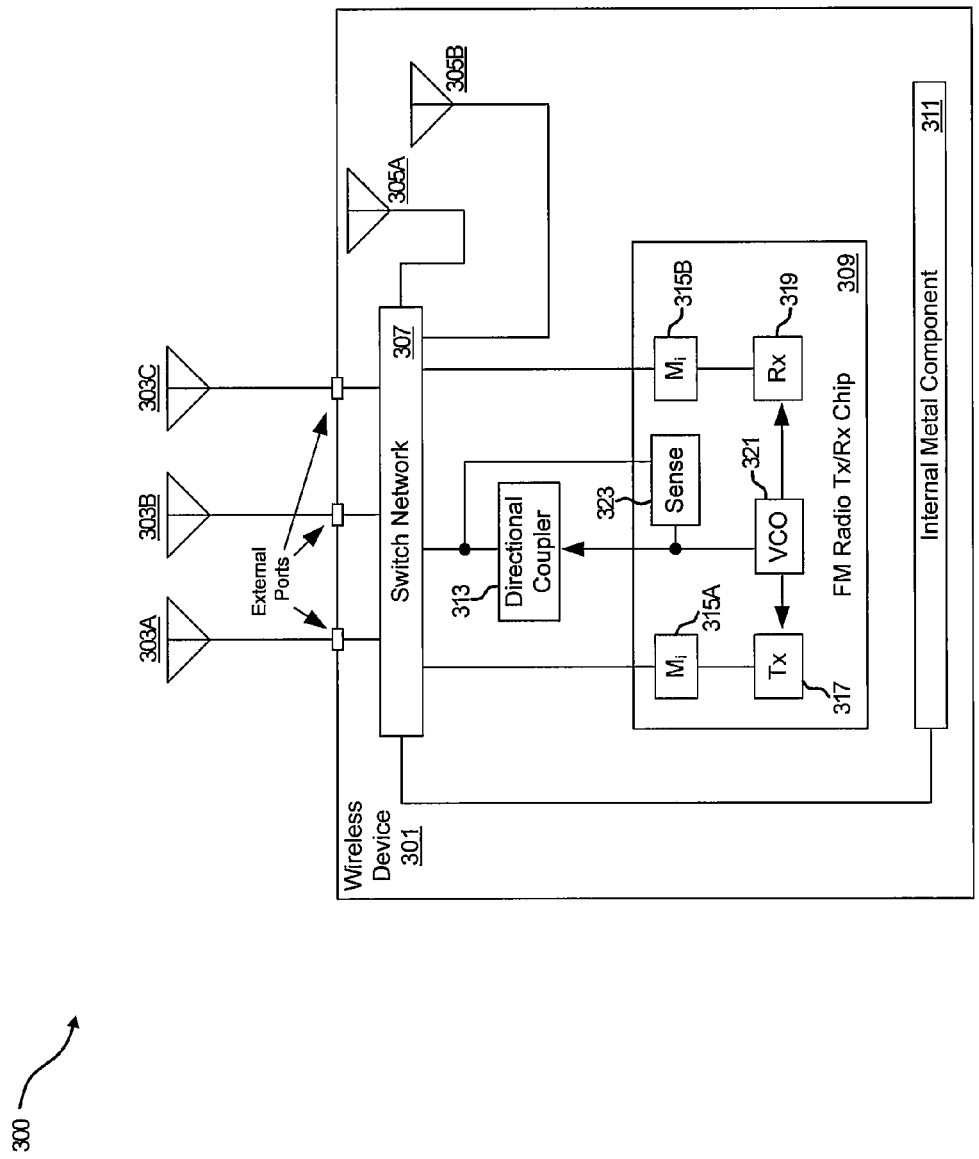
FIG. 3 is a block diagram illustrating an exemplary wireless device incorporating automatic antenna sensing and switching, in accordance with an embodiment of the invention.

FIG. 3 is a block diagram illustrating an exemplary wireless device incorporating automatic antenna sensing and switching, in accordance with an embodiment of the invention. Referring to FIG. 3, there is shown a wireless system 300 comprising a wireless device 301 and external antennas 303A, 303B and 303C. The wireless device 301 may comprise internal antennas 305A and 305B, a switch network 307, an FM radio transmit/receive (FM radio Tx/Rx) chip 309, an internal metal component 311 and a directional coupler 325. The FM radio Tx/Rx chip 309 may comprise on-chip impedance matching blocks 315A and 315B, an FM transmit (Tx) block 317, an FM receive (Rx) block 319, a voltage controller oscillator (VCO) 321, and a sense block 323.

The external antennas 303A, 303B and 303C may comprise externally coupled antennas that each may be enabled for transmitting and receiving a signal conforming to a particular wireless protocol, such as Bluetooth, RFID, and/or FM, for example. The external antennas 303A-C may comprise devices that may be coupled to the wireless device 301, and may be enabled to perform other functions, such as earphones generating audio signals, for example, that may also serve as externally coupled antennas for transmitting and/or receiving FM signals.

The internal antennas 305A and 305B may similarly be enabled for transmitting and receiving a signal conforming to a particular wireless protocol, and may be located internal to the case enclosing the wireless device 301. The internal metal component 311, may comprise a metal component located within and/or part of the wireless device enclosure, which when coupled to one or more of the antennas may alter the transmit/receive characteristics, such as transmitted and/or received power, for example, of the coupled one or more antennas. The number of internal metal components may not be limited to the number shown in FIG. 3. Accordingly, the wireless device 301 may comprise any number, or even all of the internal metal components that may affect the Tx/Rx characteristics of the system. The internal metal component 311 or components, as well as externally coupled devices that may act as antennas, may be utilized in instances where the transmit/receive characteristics may be improved, such as in the transmission and/or reception of FM signals where the increased size of the antenna may increase signal strength.

The FM radio Tx/Rx chip 309 may comprise suitable circuitry, logic and/or code that may enable transmission and reception of FM signals. The FM radio Tx block 317 may comprise suitable circuitry, logic and/or code that may enable transmission of FM signals via the switch network 307 and selected one or more of the external antennas 303A, 303B, 303C, and/or one or more of the internal antennas 305A and 305B. In the same manner, the FM radio Rx block 319 may comprise suitable circuitry, logic and/or code that may enable reception of FM signals over the same selected antennas.

The on-chip impedance matching blocks 315A and 315B may comprise suitable circuitry, logic and/or code that may enable impedance matching of the FM radio Tx block 317 and the FM radio Rx block 319, respectively, in conjunction with the off-chip impedance matching blocks 313A and 313B, with the selected one or more antennas. The on-chip impedance matching blocks 315A and 315B may comprise selectable capacitors of varying capacitance values, for example, such that the impedance matching may be performed at various frequencies and/or with multiple antenna configurations.

The VCO 321 may comprise suitable circuitry, logic and/or code that may enable generation of a variable frequency output signal that may be utilized by the FM radio Tx block 317 and the FM radio Rx block 319 for transmission and reception of FM signals, respectively. Additionally, the VCO 321 may be enabled to generate a test signal that may be utilized to test for the presence of an externally coupled device at one or more external ports on the wireless device 301. The frequency of the output signal may be a function of an input voltage, and may be controlled via a processor, such as the processor 230, described with respect to FIG. 2. In another embodiment of the invention, the VCO 321 may comprise a direct digital frequency synthesizer (DDFS).

The sense block 323 may comprise suitable circuitry, logic and/or code that may enable the sensing of the magnitude of signals at the outputs of the VCO 321 and the directional coupler 313. The magnitudes may be determined from the magnitude of the voltages measured, such as with an envelope detector, for example. The sense block 323 may be integrated on the FM radio Tx/Rx chip 309, or may be external to the FM radio Tx/Rx chip 309.

The switch network 307 may comprise suitable circuitry, logic and/or code that may enable selection of one or more of the antennas and metal components that may be utilized to transmit and receive FM signals. The switch network may be controlled by a processor, such as the processor 230, described with respect to FIG. 2. The switch network 307 may couple one or more of the antennas comprising the external antennas 303A, 303B, 303C, and/or one or more of the internal antennas 305A and 305B, as well as one or more metal components, such as the internal metal component 311, to the FM radio Tx/Rx chip 309 and/or to the directional coupler 313. The internal and external antennas and internal metal component or components may be connected in series or parallel to obtain multiple antenna configurations.

The switch network 307 may also comprise circuitry that may enable impedance matching, in conjunction with the on-chip impedance matching blocks 315A and 315B, of the FM radio Tx block 317 and/or the FM radio Rx block 319 to the selected antenna configuration. The impedance matching circuitry incorporated within the switch network 307 may comprise selectable inductors of varying inductance values, for example, such that the impedance matching may be performed at various frequencies and/or with multiple antenna configurations. In another embodiment of the invention, in instances where the FM radio Tx/Rx chip may be capable of simultaneous FM transmission and reception, as described with respect to FIG. 2, the switch network 307 may be enabled to couple both the Tx block 317 and the Rx block 319 to the selected antenna configuration.

The directional coupler 313 may comprise suitable circuitry, logic and/or code that may enable passing a signal in one direction while rejecting signals traveling in the opposite direction. The directional coupler 313 may receive as an input, an output signal generated by the VCO 321, and generate an output signal that may be communicated to the switch network 307. The directional coupler 313 may allow signals traveling in the direction from the VCO 321 toward the switch network 307 and reject signals traveling in the direction from the switch network 307 toward the VCO 321. Signals traveling in the direction from the switch network 307 toward the VCO 321 may be generated by reflections of signals due to impedance mismatch with an antenna configuration and/or a lack of a coupled device at a particular external connection port on the wireless device 301.

In operation, the FM radio Tx block 317 may be enabled to generate an FM signal to be transmitted by the internal and/or external antennas selected by the switch network 307. The on-chip impedance matching block 315A may be enabled to match the output impedance of the FM radio Tx 317 to the antennas selected by the switch network 307. The switch network 307 in conjunction with the on-chip impedance match block 315A may also provide impedance match to the antennas selected by the switch network 307.

The FM radio Rx block 319 may be enabled to receive an FM signal that may be received by the internal and/or external antennas selected by the switch network 307. The on-chip impedance matching block 315B may be enabled to match the input impedance of the FM radio Rx 319 to the antennas selected by the switch network 307. The switch network 307 in conjunction with the on-chip impedance match block 315B may also provide impedance match with the antennas selected by the switch network 307.

In an embodiment of the invention, the VCO 321 may generate a test signal that may be utilized to test whether external devices which may function as an antenna may be coupled to the wireless device 301. The directional coupler 313 may allow the signal generated by the VCO 321 to be routed to the switch network 307, while rejecting signals that may be reflected back to the directional coupler 313. The magnitude of the signals, such as the voltage measured by an envelope detector, for example, may be compared at the input and the output of the directional coupler. In an exemplary embodiment of the invention, the ratio of the magnitudes may be monitored for changes, which may indicate an external device has been coupled to the wireless device 301, may be stored in a memory, such as the memory 228, described with respect to FIG. 2.

A processor, such as the processor 230, may be utilized to configure the switch network 307 to test for the presence of an external device, which may comprise external antennas 303A-C. The testing for the presence of externally coupled devices that may function as an antenna may be performed at random, periodically or continuously. In cases where the monitoring may be done continuously, the monitoring may be done in a manner in which the sense block 323 and/or the directional coupler 313 do not cause excessive loading on the transmission and/or reception of signals by the FM radio Tx 317 and the FM radio Rx 319.

Figure 4:
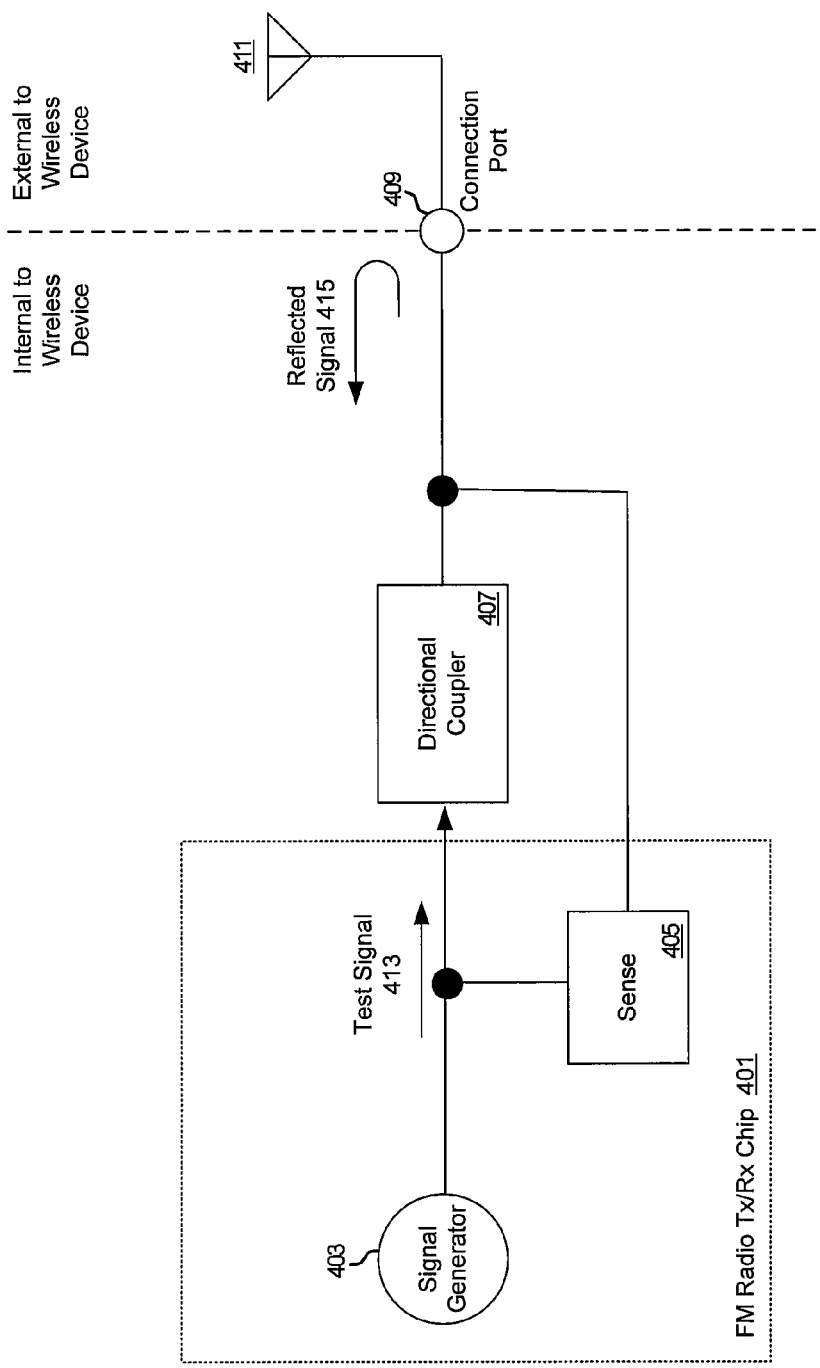
FIG. 4 is a block diagram illustrating an exemplary wireless device antenna sensing system, in accordance with an embodiment of the invention.

FIG. 4 is a block diagram illustrating an exemplary wireless device antenna sensing system, in accordance with an embodiment of the invention. Referring to FIG. 4, there is shown an FM radio Tx/Rx chip 401, a directional coupler 407, a connection port 409 and an antenna 411. There is also shown a test signal 413 and a reflected signal 415. The FM radio Tx/Rx chip 410 may be substantially similar to the FM radio Tx/Rx chip 309, described with respect to FIG. 3, and may comprise a signal generator 403 and a sense block 405.

The FM radio Tx/Rx block 401, the sense block 403, the directional coupler 407 may be substantially similar to the FM radio Tx/Rx block 309, the sense block 323 and the directional coupler 313 described with respect to FIG. 3. The signal generator 403 may be substantially similar to the VCO 321, or in another embodiment of the invention may comprise a separate signal generator. The signal generator 403 may comprise a direct digital frequency synthesizer (DDFS).

The connection port 409 may comprise suitable circuitry, logic and/or code that may enable coupling an external device and/or antenna to the wireless device, such as the wireless device 301 described with respect to FIG. 3. The external device may comprise earphones, for example, which may also act as an antenna for the wireless device.

The antenna 411 may comprise an externally coupled antenna, or in another embodiment of the invention may comprise a device coupled to the connection port 409 for other purposes, such as generating an audio signal via earphones, for example.

In operation, the signal generator 403 may generate a test signal 413, which may comprise an AC signal and may be utilized to sense whether a device may be coupled to the connection port 409. The test signal 413 may be communicated to the directional coupler 407. As the test signal 413 may be traveling in the direction allowed by the directional coupler 407, the test signal 413 may be allowed to pass through to the connection port 409. In instances where there is no antenna coupled to the connection port 409, the reflected signal may be large due the large impedance ratio as a result of the infinite impedance at the connection port 409. In instances where the antenna 411 may be coupled to the connection port 409, the reflected signal may be reduced, due to the reduced impedance at the connection port 409.

The sense block 405 may measure the magnitude of the signal at the input to the directional coupler 407 and at the input side of the connection port 409, which may also comprise the output terminal of the directional coupler 407. A reflection ratio may be defined as the ratio of the reflected signal 415 to the test signal 413, and may be proportional to the impedance seen at the connection port 409. The open circuit ratio, where there may be no antenna coupled to the connection port 409, may be stored in memory, such as the memory 228, described with respect to FIG. 2. In instances where this ratio may change, such as when the antenna 411 may be connected or disconnected, for example, the sense block 405 may measure a change in the reflection ratio. The change in the reflection ratio may be communicated to a processor, such as the processor 230, also described with respect to FIG. 2. In instances where it is determined that an antenna may be coupled to the connection port 409, processor 230 may then utilize the antenna 411 to transmit and/or receive FM signals, for example, via a switch network, such as the switch network 307, described with respect to FIG. 3.

Figure 5:
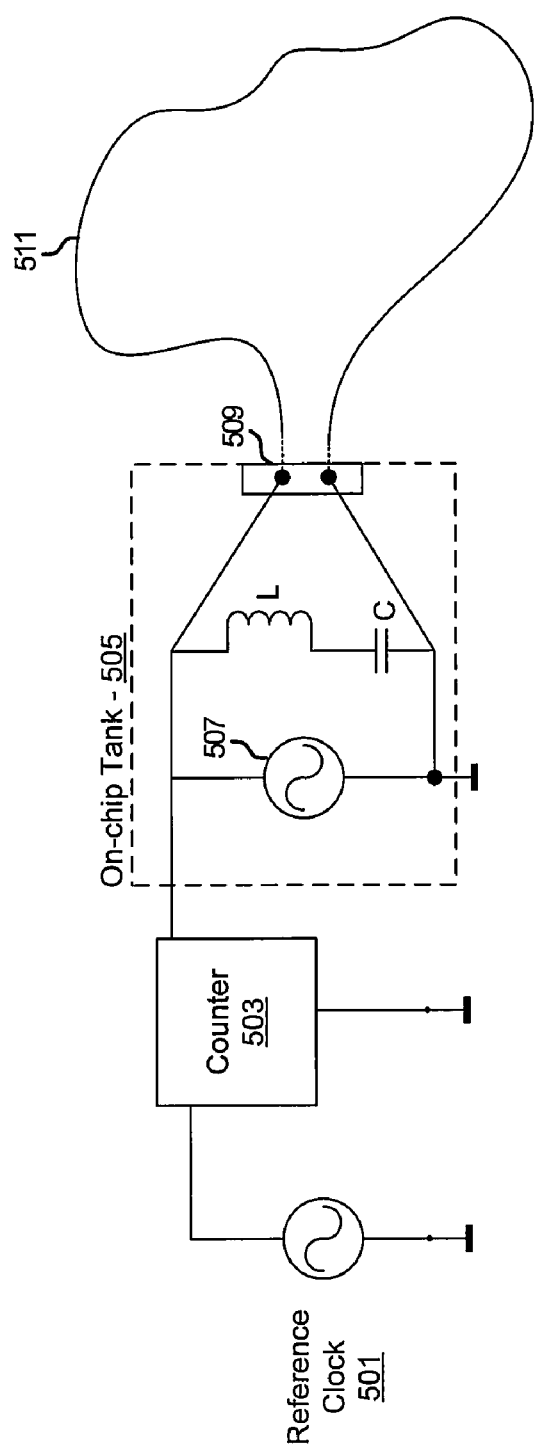
FIG. 5 is a block diagram illustrating an alternative embodiment of an external antenna sensing system, in accordance with an embodiment of the invention.

FIG. 5 is a block diagram illustrating an alternative embodiment of an external antenna sensing system, in accordance with an embodiment of the invention. Referring to FIG. 5, there is shown a reference clock 501, a counter 503, an on-chip tank circuit 505, external connection port 509 and an external antenna 511. The on-chip tank circuit 505 may comprise an oscillator 507, an inductor L and a capacitor C. The reference clock 501 and the oscillator 507 may be substantially similar to the VCO 321, described with respect to FIG. 3, and may comprise an on-chip clock signal source. The counter 503 may comprise suitable circuitry, logic and/or code that may enable counting of the number of oscillations of a signal per given time period for determining the frequency of the signal.

In operation, the on-chip tank circuit 505 may generate a signal at a given frequency in instances where no external antenna, such as the external antenna 511, may be coupled to the external connection port 509. In instances when the external antenna 511 may be coupled to the connection port 509, the impedance may be changed, such that the frequency of the on-chip tank circuit 505 may be changed, as detected by the counter 503. As with the directional coupler technique described with respect to FIG. 3, the on-chip tank circuit 505 may be switched to the external connection port 509 on a periodic basis or on a continual basis utilizing a switch network, such as the switch network 307.

Figure 6:
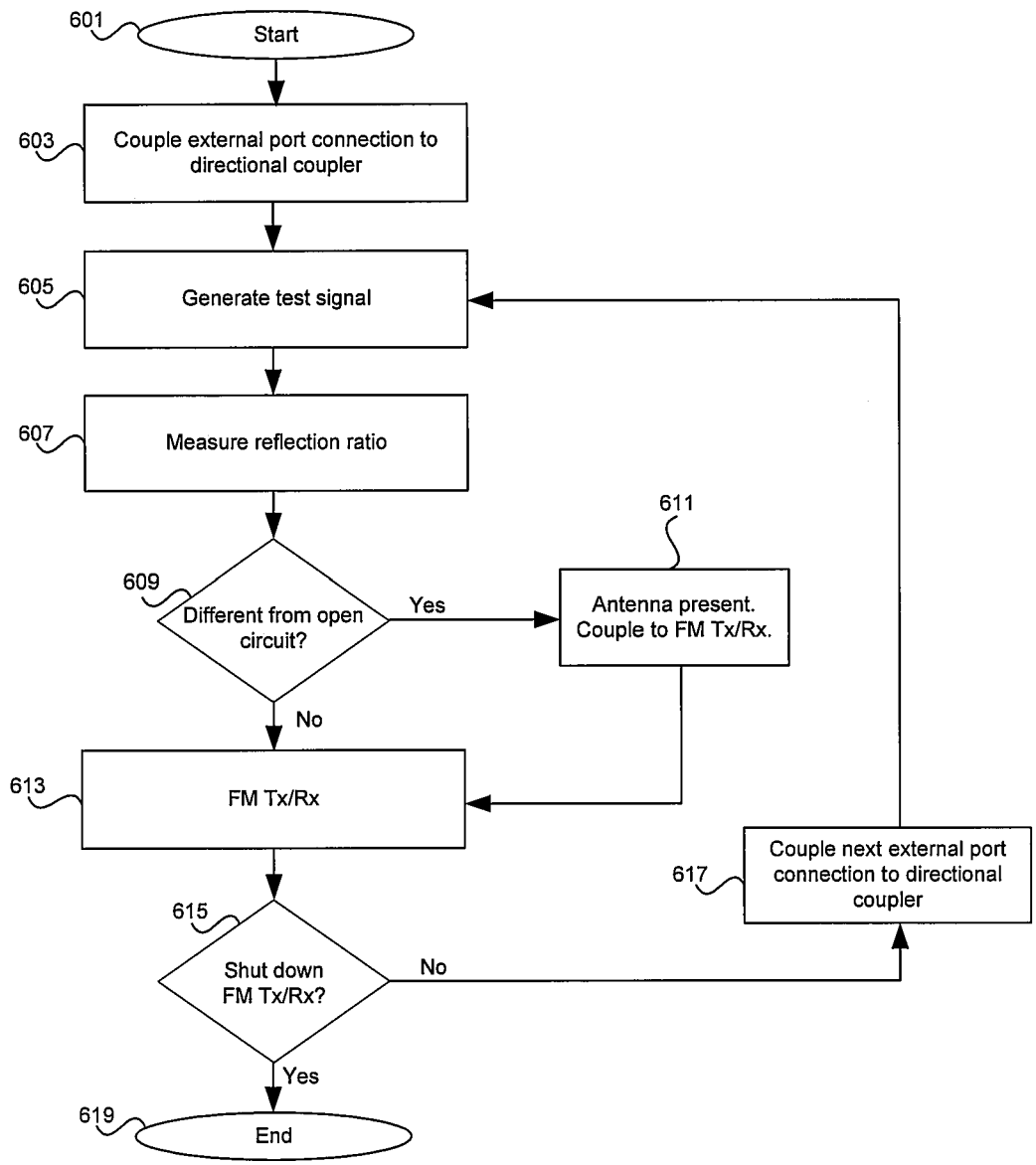
FIG. 6 is a flow diagram illustrating an exemplary external antenna sensing process, in accordance with an embodiment of the invention.

FIG. 6 is a flow diagram illustrating an exemplary external antenna sensing process, in accordance with an embodiment of the invention. Referring to FIG. 6, in step 603, after start step 601, an external port connection, such as the external port connection 409 may be coupled to the directional coupler via the switch network 307. In step 605, a test signal may be generated by the signal generator 403 and communicated to the external port connection. The reflection ratio may be measured by the sense block 405 in step 607. In step 609, if the reflection ratio may be different than an open circuit reflection ratio, an antenna may be present at the external port connection and may then be coupled to the FM radio Tx/Rx, such as the FM radio Tx 317 and the FM radio Rx 319, followed by step 613 where FM signals may be transmitted and received. In instances where the reflection ratio may be equal to the open circuit reflection ratio, the exemplary steps may proceed directly to step 613 to transmit and receive FM signals. In step 615, in instances where it may not be desirable to shut down the FM radio Tx/Rx, the exemplary steps may proceed to step 617 where a next external connection port may be coupled to the directional coupler and the exemplary steps may return to step 605 to repeat the check for an external antenna. If in step 615, it may be desirable to shut down the FM Tx/Rx, the exemplary steps may proceed to end step 619.

In an embodiment of the invention, a method and system are disclosed for detecting whether an external antenna 303A-C may be coupled to one or more ports external to the wireless device 301. FM signals may be transmitted and/or received via the FM radio transmitter 317 and/or FM radio receiver 319 respectively, when the external antenna 303A-C may be detected. The FM radio transmitter 317 may be configured for transmitting the FM signal via the external antenna 303A-C when the external antenna 303A-C may be detected, and the FM radio receiver 319 may be configured for receiving the FM signals via the external antenna 303A-C when the external antenna 303A-C may be detected. The decoupling of one or more external antennas 303A-C from one or more of the external ports may be detected.

The FM radio transmitter 317 and FM radio receiver 319 may be configured to transmit and/or receive FM signal, respectively, utilizing antennas 305A-B and/or 311 internal to the wireless device when the decoupling of the one or more external antennas 303A-C may be detected. One or more test signals may be generated within the chip 309 for detecting whether the external antenna 303A-C may be coupled to the one or more external ports of the wireless device 301. A reflected signal 415 resulting from a reflection of the generated one or more test signals 413 when the generated test signal may be communicated to the one or more external ports of the wireless device 301 may be measured and compared to a prestored value corresponding to a reflection due to an open circuit at the one or more external ports of the wireless device. The test signal may comprise an AC signal.

In an embodiment of the invention, a method and system are disclosed for communicating a test signal 413 from a signal generator 321 integrated on a chip 309 to each of one or more port connections external to the wireless device 301. A portion of the test signal that may be reflected 415 by each of the external port connections may be measured and compared to a prestored value corresponding to a reflection due to an open circuit at each of the external port connections. In instances where the reflected signal 415 indicates that an external antenna 303A-C may be coupled to the external port, the external port may be coupled to the FM radio Tx/Rx 309. The signal generator 321 integrated on the chip 309 may comprise a voltage controlled oscillator or a direct digital frequency synthesizer. The coupling of the signal generator 321 to each of the external port connections may be performed on a periodic basis. The antenna 303A-C coupled to any of the external connections may comprise headphones. The one or more external port connections may be decoupled from the FM radio Tx/Rx 309 when the reflected portion 415 of the test signal may indicate that no antenna may be coupled to any of the external port connections. The test signal may comprise an AC signal and/or one or more pulses.

Certain embodiments of the invention may comprise a machine-readable storage having stored thereon, a computer program having at least one code section for communicating information within a network, the at least one code section being executable by a machine for causing the machine to perform one or more of the steps described herein for auto detecting and auto switching antennas in a multi-antenna FM transmit/receive system.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
   in a wireless device comprising an FM radio transmitter and an FM radio receiver integrated within a chip:
   detecting via said chip, whether an external antenna is coupled to one or more external port of said wireless device by generating from within said chip, one or more test signals; and
   transmitting and/or receiving FM signals via said FM radio transmitter and/or said FM radio receiver respectively, when said external antenna is detected.

2. The method according to claim 1, comprising configuring said FM radio transmitter for transmitting said FM signal via said external antenna when said external antenna is detected.

3. The method according to claim 1, comprising configuring said FM radio receiver for receiving said FM signals via said external antenna when said external antenna is detected.

4. The method according to claim 1, comprising detecting when said external antenna is decoupled from said one or more external ports of said wireless device.

5. The method according to claim 4, comprising configuring said FM radio transmitter for transmitting said FM signals via one or more antennas internal to said wireless device.

6. The method according to claim 4, comprising configuring said FM radio receiver for receiving said FM signals via one or more antennas internal to said wireless device.

7. The method according to claim 1, comprising measuring a reflected signal resulting from reflection of said generated one or more test signals when said generated test signal is communicated to said one or more external ports of said wireless device.

8. The method according to claim 7, comprising comparing said measured reflected signal to a prestored value corresponding to a reflection due to an open circuit at said one or more external ports of said wireless device.

9. The method according to claim 1, wherein said generated one or more test signals comprises an AC signal.

10. The method according to claim 1, comprising detecting when said external antenna is connected to said one or more external port utilizing an LC tank circuit.

11. The method according to claim 10, comprising detecting via said LC tank circuit a change in oscillation frequency when said external antenna is coupled to said one or more external port.

12. A system for wireless communication, the system comprising:
   one or more circuits in a wireless device, said one or more circuits comprising an FM radio transmitter and an FM radio receiver integrated within a chip, said one or more circuits being operable to detect, whether an external antenna is coupled to one or more external port of said wireless device by generating one or more test signals; and
   said one or more circuits enable transmission and/or reception of FM signals utilizing said FM radio transmitter and/or said FM radio receiver respectively, when said external antenna is detected.

13. The system according to claim 12, wherein said one or more circuits enable configuration of said FM radio transmitter for transmitting said FM signal via said external antenna when said external antenna is detected.

14. The system according to claim 12, wherein said one or more circuits enable configuration of said FM radio receiver for receiving said FM signals via said external antenna when said external antenna is detected.

15. The system according to claim 12, wherein said one or more circuits enable detection of decoupling of said external antenna from said one or more external ports of said wireless device.

16. The system according to claim 15, wherein said one or more circuits enable configuration of said FM radio transmitter for transmitting said FM signals via one or more antennas internal to said wireless device.

17. The system according to claim 15, wherein said one or more circuits enable configuration of said FM radio receiver for receiving said FM signals via one or more antennas internal to said wireless device.

18. The system according to claim 12, wherein said one or more circuits enable measurement of a reflected signal resulting from reflection of said generated one or more test signals when said generated test signal is communicated to said one or more external ports of said wireless device.

19. The system according to claim 18, wherein said one or more circuits enable comparison of said measured reflected signal to a prestored value corresponding to a reflection due to an open circuit at said one or more external ports of said wireless device.

20. The system according to claim 12, wherein said generated one or more test signals comprises an AC signal.

21. The system according to claim 12, wherein said one or more circuits enable detecting when said external antenna is connected to said one or more external port utilizing an LC tank circuit.

22. The system according to claim 21, wherein said one or more circuits enable detecting via said LC tank circuit a change in oscillation frequency when said external antenna is coupled to said one or more external port.

23. A method for wireless communication, the method comprising:

in a wireless device comprising an FM radio transmitter and an FM radio receiver integrated within a chip:
detecting via said chip, whether an external antenna is coupled to one or more external port of said wireless device utilizing an LC tank circuit; and
transmitting and/or receiving FM signals via said FM radio transmitter and/or said FM radio receiver respectively, when said external antenna is detected.

24. The method according to claim 23, comprising configuring said FM radio transmitter for transmitting said FM signal via said external antenna when said external antenna is detected.

25. The method according to claim 23, comprising configuring said FM radio receiver for receiving said FM signals via said external antenna when said external antenna is detected.

26. The method according to claim 23, comprising detecting when said external antenna is decoupled from said one or more external ports of said wireless device.

27. The method according to claim 26, comprising configuring said FM radio transmitter for transmitting said FM signals via one or more antennas internal to said wireless device.

28. The method according to claim 23, comprising configuring said FM radio receiver for receiving said FM signals via one or more antennas internal to said wireless device.

29. The method according to claim 23, comprising detecting via said LC tank circuit a change in oscillation frequency when said external antenna is coupled to said one or more external port.

30. A system for wireless communication, the system comprising:

one or more circuits in a wireless device, said one or more circuits comprising an FM radio transmitter and an FM radio receiver integrated within a chip, said one or more circuits being operable to detect, whether an external antenna is coupled to one or more external port of said wireless device utilizing an LC tank circuit; and
said one or more circuits enable transmission and/or reception of FM signals utilizing said FM radio transmitter and/or said FM radio receiver respectively, when said external antenna is detected.

31. The system according to claim 30, wherein said one or more circuits enable configuration of said FM radio transmitter for transmitting said FM signal via said external antenna when said external antenna is detected.

32. The system according to claim 30, wherein said one or more circuits enable configuration of said FM radio receiver for receiving said FM signals via said external antenna when said external antenna is detected.

33. The system according to claim 30, wherein said one or more circuits enable detection of decoupling of said external antenna from said one or more external ports of said wireless device.

34. The system according to claim 33, wherein said one or more circuits enable configuration of said FM radio transmitter for transmitting said FM signals via one or more antennas internal to said wireless device.

35. The system according to claim 33, wherein said one or more circuits enable configuration of said FM radio receiver for receiving said FM signals via one or more antennas internal to said wireless device.

36. The system according to claim 30, wherein said one or more circuits enable detecting via said LC tank circuit a change in oscillation frequency when said external antenna is coupled to said one or more external port.

* * * * *